United States Patent
Ma et al.

(10) Patent No.: US 9,917,281 B2
(45) Date of Patent: Mar. 13, 2018

(54) TOP-EMITTING WHITE ORGANIC LIGHT-EMITTING DIODES HAVING IMPROVED EFFICIENCY AND STABILITY

(71) Applicants: NITTO DENKO CORPORATION, Ibaraki-shi, Osaka (JP); Liping Ma, San Diego, CA (US); Shijun Zheng, San Diego, CA (US); David T. Sisk, San Diego, CA (US)

(72) Inventors: Liping Ma, San Diego, CA (US); Shijun Zheng, San Diego, CA (US); David T. Sisk, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 420 days.

(21) Appl. No.: 14/426,502

(22) PCT Filed: Sep. 5, 2013

(86) PCT No.: PCT/US2013/058329
§ 371 (c)(1),
(2) Date: Mar. 6, 2015

(87) PCT Pub. No.: WO2014/039721
PCT Pub. Date: Mar. 13, 2014

(65) Prior Publication Data
US 2015/0228932 A1    Aug. 13, 2015

Related U.S. Application Data

(60) Provisional application No. 61/698,351, filed on Sep. 7, 2012.

(51) Int. Cl.
*H01L 51/00* (2006.01)
*H01L 51/52* (2006.01)
*H01L 51/50* (2006.01)

(52) U.S. Cl.
CPC ...... *H01L 51/5293* (2013.01); *H01L 51/5004* (2013.01); *H01L 51/504* (2013.01);
(Continued)

(58) Field of Classification Search
None
See application file for complete search history.

(56) References Cited

U.S. PATENT DOCUMENTS

| | | | |
|---|---|---|---|
| 6,933,522 B2 * | 8/2005 | Lin | H01L 51/5036 257/103 |
| 7,037,601 B2 * | 5/2006 | Hatwar | H01L 51/0079 313/504 |

(Continued)

FOREIGN PATENT DOCUMENTS

| | | |
|---|---|---|
| EP | 1 811 586 A1 | 7/2007 |
| EP | 2 133 932 A1 | 12/2009 |

OTHER PUBLICATIONS

Okumura, Yasuaki et al., "Low Threshold Gain-Narrowing Characteristics of Fluorescent Styrylbenzene Derivatives as a Guest Molecule in an Organic Thin-Film Optical Waveguide", Chemistry Letter, No. 7, Jan. 1, 2000, pp. 754-755.

*Primary Examiner* — Robert S Loewe
(74) *Attorney, Agent, or Firm* — K&L Gates LLP; Louis C. Cullman; Robert W. Winn

(57) ABSTRACT

The present disclosure relates to an emissive construct, which can be used in various OLED applications, for example, top-emission white organic light-emitting diodes. The emissive construct can include an optional second fluorescent emissive layer having an emitter with a second T1, a first fluorescent emissive layer having an emitter with a first T1, the first T1 being greater than the second T1 value, a hole-blocking layer, and a phosphorescent emissive layer.

19 Claims, 6 Drawing Sheets

(52) U.S. Cl.
CPC ...... *H01L 51/5016* (2013.01); *H01L 51/5044* (2013.01); *H01L 51/5096* (2013.01); *H01L 51/0059* (2013.01); *H01L 51/0067* (2013.01); *H01L 51/0072* (2013.01); *H01L 51/0085* (2013.01); *H01L 2251/5376* (2013.01)

(56) References Cited

U.S. PATENT DOCUMENTS

| | | | | |
|---|---|---|---|---|
| 7,377,829 B2 * | 5/2008 | Ko | ...................... | H01L 51/5036 445/24 |
| 7,474,049 B2 * | 1/2009 | Liu | ........................ | C09K 11/06 313/504 |
| 8,299,456 B2 * | 10/2012 | Seo | ..................... | H01L 51/5016 257/40 |
| 8,558,224 B2 * | 10/2013 | Sawabe | ............... | H01L 51/5044 257/40 |
| 8,816,329 B2 * | 8/2014 | Krause | .................... | H01L 51/00 257/288 |
| 2006/0279203 A1 * | 12/2006 | Forrest | ................. | H01L 51/0072 313/504 |
| 2007/0164278 A1 * | 7/2007 | Lee | ..................... | H01L 51/5036 257/40 |
| 2008/0102310 A1 * | 5/2008 | Thompson | .......... | H01L 51/5036 428/690 |
| 2008/0258606 A1 | 10/2008 | Butler et al. | | |
| 2008/0284317 A1 | 11/2008 | Liao et al. | | |
| 2008/0312437 A1 * | 12/2008 | Inoue | ..................... | C09K 11/06 544/225 |
| 2009/0091240 A1 * | 4/2009 | Ikeda | .................... | C07D 403/10 313/504 |
| 2009/0091255 A1 * | 4/2009 | Lee | ..................... | H01L 51/5016 313/504 |
| 2009/0191427 A1 | 7/2009 | Liao et al. | | |
| 2010/0044689 A1 * | 2/2010 | Nishimura | ............. | C09K 11/06 257/40 |
| 2010/0314612 A1 | 12/2010 | Lee et al. | | |
| 2011/0073853 A1 * | 3/2011 | Smith | ................. | H01L 51/5036 257/40 |
| 2011/0140093 A1 | 6/2011 | Zheng et al. | | |
| 2012/0179008 A1 | 7/2012 | Sisk et al. | | |

* cited by examiner

| Phosphor EML-2 |
|---|
| Phosphor EML-1 |
| Blocking layer |
| High-T1 FL-Blue |
| Low-T1 FL-Blue |

FIG. 1

| OPTIONAL LIGHT SCATTERING |
|---|
| CATHODE |
| OPTIONAL LIGHT EMISSION ENHANCEMENT |
| OPTIONAL ELECTRON-INJECTION |
| OPTIONAL ELECTRON-TRANSPORT |
| EMISSIVE CONSTRUCT |
| OPTIONAL HOLE-TRANSPORT |
| OPTIONAL HOLE-INJECTION |
| ANODE |
| OPTIONAL INSULATING |
| OPTIONAL SUBSTRATE |

FIG. 2

| Light-scattering layer |
|---|
| Capping layer |
| Semi-transparent cathode |
| EIL |
| ETL |
| Phosphor EML-2 |
| Phosphor EML-1 |
| Blocking layer |
| High-T1 FL-Blue |
| Low-T1 FL-Blue |
| HTL |
| HIL |
| Reflective Opaque anode |
| Insulating layer |
| Substrate |

FIG. 3

TOP-EMITTING WHITE ORGANIC LIGHT-EMITTING DIODES HAVING IMPROVED EFFICIENCY AND STABILITY

CROSS REFERENCE TO RELATED APPLICATIONS

This application is a national phase of PCT/US2013/058329 filed on Sep. 5, 2013, which claims priority to U.S. Provisional Application No. 61/698,351 filed on Sep. 7, 2012, the entire disclosures of which are incorporated by reference.

SUMMARY

The present application relates to top-emission white-color organic light-emitting diode (OLED) devices for lighting applications.

An embodiment provides an emissive construct, which can be used in various OLED applications, for example, top-emission white organic light-emitting diodes (TE-WOLED).

Some embodiments include an emissive construct comprising: a first fluorescent emissive layer comprising a first fluorescent emitter having a first T1; a blocking layer comprising hole blocking material having a third T1, and disposed over the first fluorescent emissive layer; wherein the third T1 is higher than or equal to said first T1; and a first phosphorescent emissive layer disposed over the blocking layer; wherein the emissive construct is configured to allow electrons to be transferred from the first phosphorescent emissive layer to the blocking layer.

Some embodiments include an emissive construct comprising: a first fluorescent emissive layer comprising a first fluorescent emitter having a first T1; a blocking layer comprising hole blocking material having a third T1, and disposed over the first fluorescent emissive layer; wherein the third T1 is higher than or equal to said first T1; a first phosphorescent emissive layer disposed over the blocking layer; wherein the emissive construct is configured to allow electrons to be transferred from the first phosphorescent emissive layer to the blocking layer; and a second phosphorescent emissive layer disposed over said first phosphorescent emissive layer; wherein the emissive construct is configured to allow electrons to be transferred from the second phosphorescent emissive layer to the first phosphorescent emissive layer.

Some embodiments include an emissive construct comprising: a second fluorescent emissive layer comprising a second fluorescent emitter having a second T1; a first fluorescent emissive layer disposed over the second fluorescent emissive layer, said first fluorescent emissive layer comprising a first fluorescent emitter having a first T1; wherein the second T1 is less than the first T1; wherein the emissive construct is configured to allow holes to be transferred from the second fluorescent emissive layer to the first fluorescent emissive layer; a blocking layer comprising hole blocking material having a third T1, and disposed over the first fluorescent emissive layer; wherein the third T1 is higher than or equal to said first T1; a first phosphorescent emissive layer disposed over the blocking layer; wherein the emissive construct is configured to allow electrons to be transferred from the first phosphorescent emissive layer to the blocking layer.

Some embodiments include an emissive construct comprising: a second fluorescent emissive layer comprising a second fluorescent emitter having a second T1; a first fluorescent emissive layer disposed over the second fluorescent emissive layer, said first fluorescent emissive layer comprising a first fluorescent emitter having a first T1; wherein the second T1 is less than the first T1; wherein the emissive construct is configured to allow holes to be transferred from the second fluorescent emissive layer to the first fluorescent emissive layer; a blocking layer comprising hole blocking material having a third T1, and disposed over the first fluorescent emissive layer; wherein the third T1 is higher than or equal to said first T1; and a first phosphorescent emissive layer disposed over the blocking layer; wherein the emissive construct is configured to allow electrons to be transferred from the first phosphorescent emissive layer to the blocking layer.

Some embodiments include an emissive construct comprising: a second fluorescent blue emissive layer comprising a second fluorescent emitter having a second T1; a first fluorescent blue emissive layer contacting the second fluorescent emissive layer, said first fluorescent blue emissive layer comprising a first fluorescent emitter having a first T1, said second T1 less than said first T1; a blocking layer comprising hole blocking material having a third T1, said third T1 higher than or equal to said first T1; a first phosphorescent emissive layer contacting said blocking layer; and a second phosphorescent emissive layer contacting said first phosphorescent emissive layer.

In an embodiment, the emissive construct is incorporated into a TE-WOLED. In an embodiment, the TE-WOLED comprises a substrate, a reflective anode, a hole-injection layer, a hole-transport layer, the emissive construct described above, the second fluorescent emissive layer (or the first fluorescent emissive layer) disposed atop the hole-transport layer; an electron-injection layer (EIL) disposed atop the emissive construct; a semi-transparent cathode disposed on the EIL; a capping layer disposed on top of the transparent cathode; a light-scattering layer on top of the capping layer; and an outcoupling layer disposed on top of the light scattering layer.

An embodiment provides an emissive construct, which can be used in various OLED applications, for example, top-emission white organic light-emitting diodes. In an embodiment, the emissive construct comprises a fluorescent emissive layer comprising a first emissive material, a partial hole-blocking layer disposed on the fluorescent emissive layer, and a phosphorescent emissive layer disposed on the partial hole-blocking layer, comprising a second host material. In an embodiment, a recombination zone is shared between the fluorescent emissive layer and the phosphorescent emissive layer. In an embodiment, the thickness of the partial hole-blocking layer is less than about one-third of the thickness of the recombination zone.

Some embodiments include a method for color tuning a white light emitting hybrid OLED device to emit a colder (more blue) light which can include inserting the emissive construct described above between an anode and a cathode; and thickening the hole-blocking layer (HBL) layer a sufficient distance to provide the desired blue shift.

Some embodiments include a method for color tuning a white light emitting hybrid OLED device to emit a warmer (more red/orange light) light comprising inserting the emissive construct described above between an anode and a cathode; and thinning the HBL layer a sufficient distance to provide the desired red shift.

Some embodiments include an emissive construct, which can be used in various OLED applications, for example, top-emission white organic light-emitting diodes. In an embodiment, the emissive construct comprises a fluorescent emissive layer comprising a first host material, a partial hole-blocking layer having a first thickness disposed on the fluorescent emissive layer, and a phosphorescent emissive layer disposed on the partial hole-blocking layer, wherein the phosphorescent emissive layer comprises a second host material. In an embodiment, a recombination zone is shared between the fluorescent emissive layer and the phosphorescent emissive layer. In an embodiment, the recombination zone has a second thickness, wherein the first thickness of the partial hole-blocking layer is less than about one-third of the second thickness.

BRIEF DESCRIPTION OF THE DRAWINGS

FIG. 1 depicts an embodiment of an emissive construct.

FIG. 2 depicts an embodiment of a TE-OLED device.

FIG. 3 depicts an embodiment of a white TE-OLED device.

DETAILED DESCRIPTION

Figure 4:
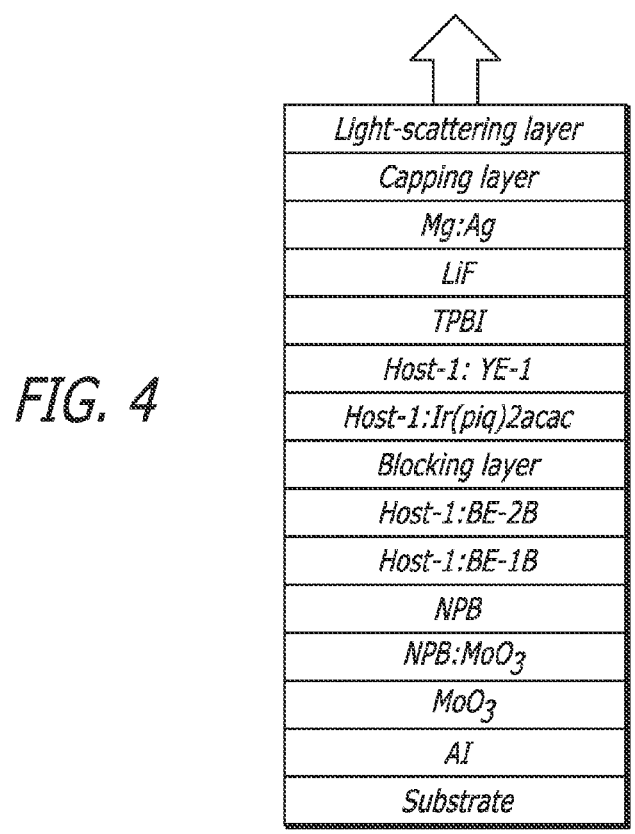
FIG. 4 depicts an embodiment of a white TE-OLED device.

Organic light-emitting materials offer a very promising field of study for energy efficient lighting applications. Many methods may increase the organic light-emitting device (OLED) device power efficiency, including modifying materials, device structure, device fabrication techniques, and light outcoupling techniques. Some OLEDs include bottom emission type OLEDs (BE-OLED), wherein the bottom electrode is a transparent conducting metal oxide, such as Indium-Tin-Oxide (ITO) deposited on top of a transparent substrate, such as glass. Generally, without light outcoupling involved, most of the emitted light in a BE-OLED can be trapped inside the device in the form of an organic mode, substrate mode, or plasma mode. When this occurs, only about 10-30% of the light escapes from the device and contributes to the lighting. Thus, the light trapped in the glass substrate may account for 20% of the total emissive light. Thus, light extraction in BE-OLEDs can greatly improve device efficiency.

Top-emission OLED (TE-OLED) devices include devices having a top electrode (generally, the cathode) that is either a semi-transparent metal cathode or a transparent conducting metal oxide like ITO. For a semi-transparent top cathode, the microcavity effect may be serious due to a relatively higher reflectance of the metal semi-transparent cathode compared with a transparent ITO cathode. This can lead to selective wavelengths passing through the cathode, contributing to the light output and viewing angle dependence of the emission spectrum. While such a feature may be good for display applications, it can also negatively affect performance for general lighting applications because white-color light emission is desired.

There are many challenging issues in TE-OLED manufacturing, including materials for the bottom reflective anode, the active cells of the light-emitting layers, and the semi-transparent cathode. Also, tuning the light enhancement layer and the light scattering layer, all while further enhancing the power efficiency of TE-OLED to meet various lighting application requirements, invokes large amounts of consideration. Compared to BE-OLED, the efficiency needs of TE-OLED require much more attention in order to meet the light application requirement.

The emissive constructs described herein (referred to hereafter as "the emissive construct(s)") help to address some of the problems mentioned above with respect to OLEDS, and can be used in various devices. Some emissive constructs may fall within general description of FIG. 1. In FIG. 1, the emissive construct comprises five layers. First, a second fluorescent emissive layer comprising a host material and/or a second fluorescent emitter, the first emitter having a second T1 value (a "Low T1 value"), is disposed over the hole-transport layer (HTL). As used herein, the term "T1" refers to the energy of the lowest energy triplet state. A first fluorescent emissive layer comprising a host material and/or a first fluorescent emitter, the first fluorescent emitter having a first T1 value (a "High T1 value"), is disposed over the second fluorescent layer. The first T1 value is greater than the second T1 value (the second T1 value is less than the first T1 value). A blocking layer, which can have a third T1 value greater than either or both of the fluorescent emitting materials is disposed over the first fluorescent emissive layer. A first phosphorescent emissive layer is disposed over the blocking layer. A second phosphorescent emissive layer can be disposed over the first phosphorescent emissive layer.

Where a first layer is disposed over a second layer, the first and second layers can be, but need not be, adjacent to one another. Where a first layer is disposed on a second layer, then the first layer is adjacent to or contacts the second layer.

In an embodiment, the emissive construct is used in an OLED, such as a BE-OLED or a TE-OLED, including a white TE-OLED. OLEDs can be constructed of various known or novel layers. In an embodiment, the OLED according comprises an anode, such as a reflective anode, and a cathode, such as a semi-transparent or transparent cathode.

The layers that comprise the emissive construct may be positioned in the device at various locations, though some useful embodiments are further described below. Preferably, the emissive construct comprises a first fluorescent emissive layer, a first phosphorescent emissive layer, and a blocking layer disposed between the first fluorescent emissive layer and the first phosphorescent emissive layer. The first fluorescent emissive layer may be disposed between a second fluorescent emissive layer and the blocking layer. In some embodiments, the second fluorescent emissive layer contacts the first fluorescent emissive layer. In some embodiments, the first fluorescent emissive layer contacts the blocking layer. Additionally, the first phosphorescent emissive layer may be disposed between the blocking layer and a second phosphorescent emissive layer. In some embodiments, the first phosphorescent emissive layer contacts second phosphorescent and/or the blocking layer. The blocking layer may be a partial hole-blocking layer.

Furthermore, additional layers may also be present.

In some embodiments, the OLED may comprise a substrate.

Some OLEDs having the emissive construct also comprise an insulating layer.

Some OLEDs having the emissive construct also comprise a hole-injection layer.

Some OLEDs having the emissive construct also comprise a hole-transport layer.

Some OLEDs having the emissive construct also comprise an electron-transport layer.

Some OLEDs having the emissive construct also comprise an electron-injection layer.

Some OLEDs having the emissive construct also comprise a light emission enhancement layer.

Some OLEDs having the emissive construct also comprise a light scattering layer.

Some embodiments of these additional layers are described in co-pending U.S. patent application Ser. No. 13/410,812, filed 2 Mar. 2012; U.S. Provisional Application No. 61/533,679, filed Sep. 12, 2011; and U.S. Provisional Application No. 61/570,667, filed Dec. 14, 2011, which are incorporated by reference in their entirety.

Each of the layers in the OLED can be present in a variety of orders from bottom to top. Some TE-OLEDs may have the layers in the following order, from bottom to top (See FIG. 2): (bottom) an optional substrate; an optional insulating layer; an anode, such as a reflective anode; an optional hole-injection layer; an optional hole-transport layer; the emissive construct; an optional electron-transport layer; an optional electron-injection layer; a cathode, such as a semi-transparent or transparent cathode; an optional light emission enhancement layer; and an optional light scattering layer (top). Each of these layers may directly contact one another, or there may be additional intervening layers in the device that are not mentioned above.

Some TE-OLEDs may have the layers in the following order, from bottom to top (See FIG. 3): (bottom) a substrate; and insulating layer; an anode, such as a reflective anode or an opaque anode; a hole-injection layer (HIL); a hole-transport layer (HTL); the second fluorescent emissive layer (Low-T1 FL-Blue); the first fluorescent emissive layer (High-T1 FL-Blue); the blocking layer; the first phosphorescent emissive layer (Phosphor EML-1); the second phosphorescent emissive layer (Phosphor EML-2); an electron-transport layer; an electron-injection layer; a cathode, such as a semi-transparent or transparent cathode; a light emission enhancement layer; and a light scattering layer. Each of these layers may directly contact one another, or there may be additional intervening layers in the device that are not mentioned above.

If present, a second fluorescent emissive layer can be a neat fluorescent layer, or may include a fluorescent dopant in a host material. Generally, a dopant is dispersed within the host material. If a dopant is present, it is usually the second fluorescent emitter. In some embodiments, the second fluorescent emissive layer is blue light-emitting. A host material can be any material that is capable of transferring exciton energy to a luminescence dopant. It may also be useful for a host material to have hole-transport and/or electron-transport properties. For a fluorescent emissive layer, the host should be able to transfer singlet exciton energy to a fluorescent dopant.

In an embodiment, a host material of the second fluorescent emissive layer (or the first fluorescent emissive layer) has an S1 energy level that is higher than a S1 energy level of a fluorescent dopant in the same fluorescent emissive layer. As used herein, "S1" refers to the lowest energy excited singlet state of an exciton. As used herein, an "exciton" refers to molecule, an atom, or an associated group of molecules and/or atoms in an excited electronic state. A higher energy S1 of a first host material may allow an exciton of the host material to more readily transfer excited singlet energy to a lower S1 energy fluorescent dopant, as compared to a dopant that has a higher S1 energy than the first host material. Transferring excited singlet energy to the dopant provides a dopant in the S1 state, which can then fluoresce.

Host materials can be, but are not necessarily, fluorescent or phosphorescent. In some embodiments, a host material may be a fluorescent material, such as a blue light-emitting fluorescent material, that is capable of fluorescence without any fluorescent dopant. If the second fluorescent emissive layer is a neat, or undoped fluorescent layer, the host material will generally be a fluorescent material, such as a blue fluorescent material.

If the second fluorescent emissive layer is neat, the host material will generally be the second fluorescent emitter. If the second fluorescent emissive layer is doped, the dopant will normally be the second fluorescent emitter.

Some examples of suitable host materials may include, but are not limited to, one or more of the following compounds:

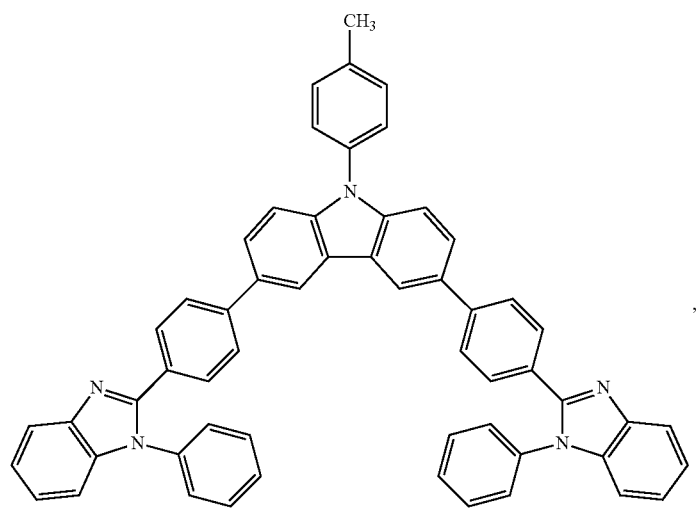
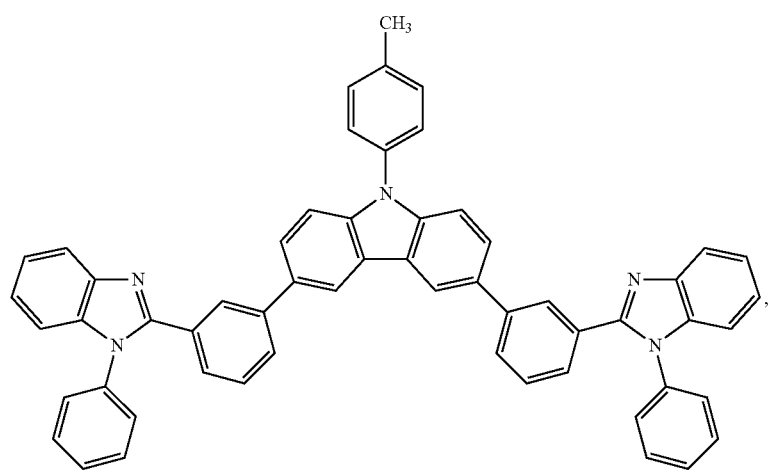
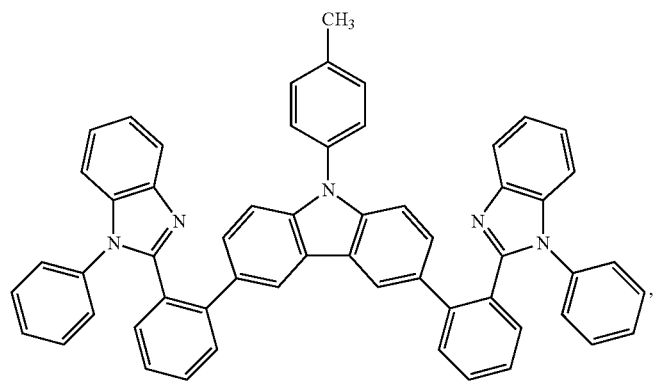

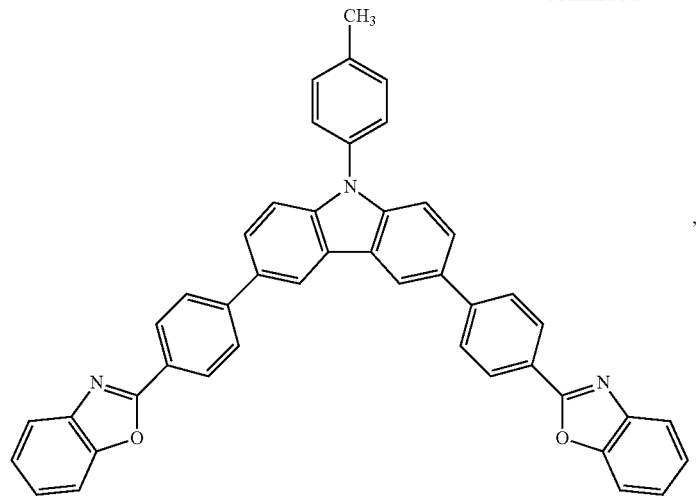
,
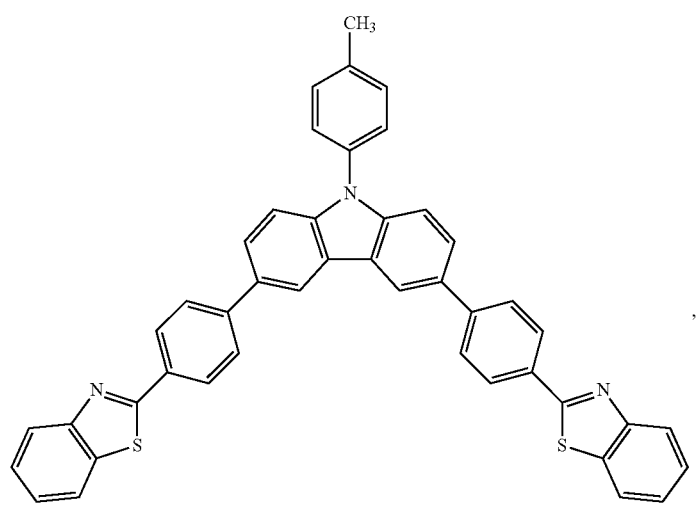
,
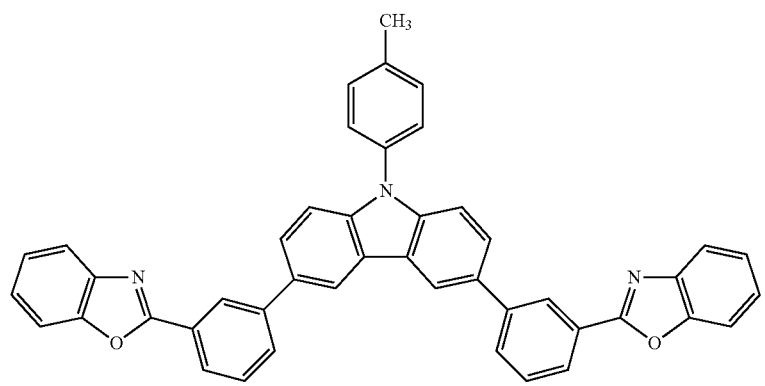
,

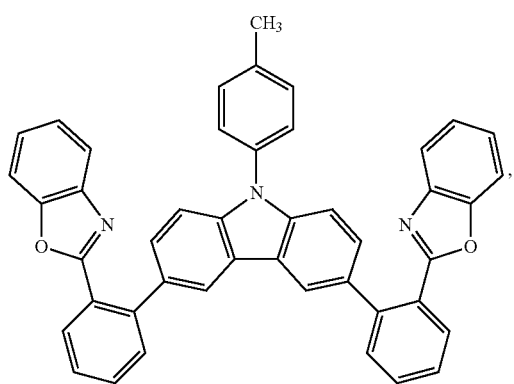
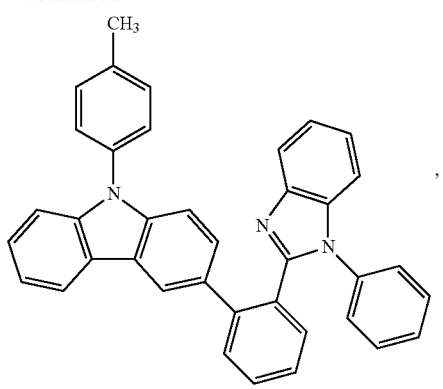
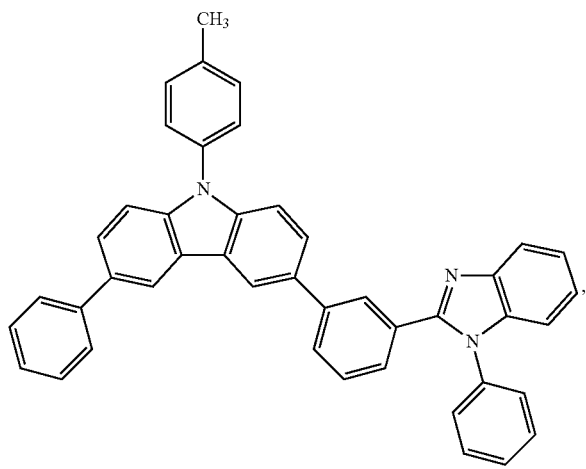
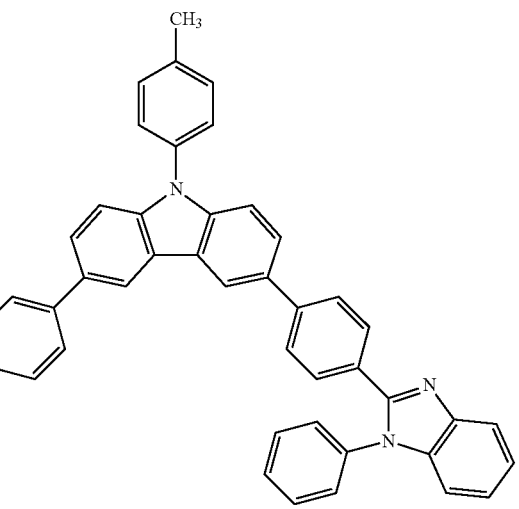
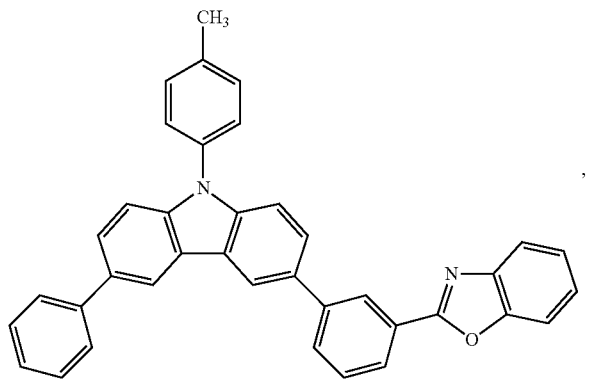
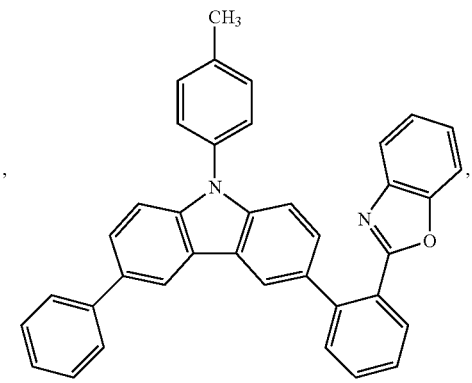

-continued
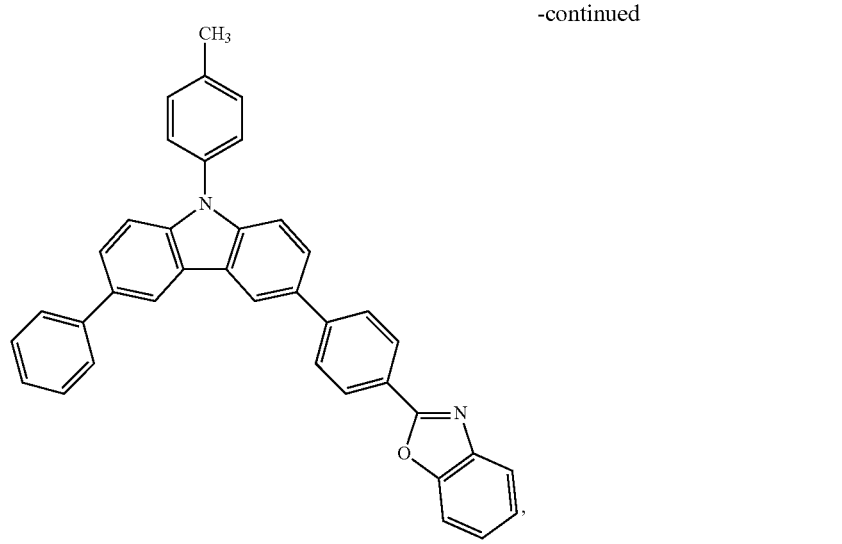
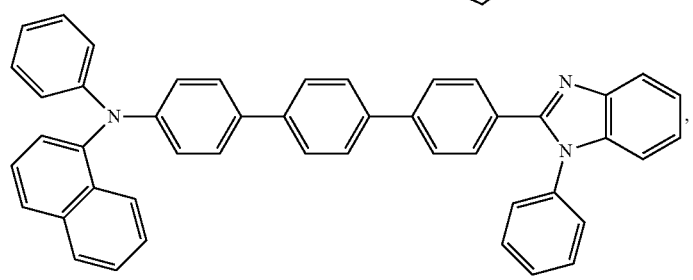
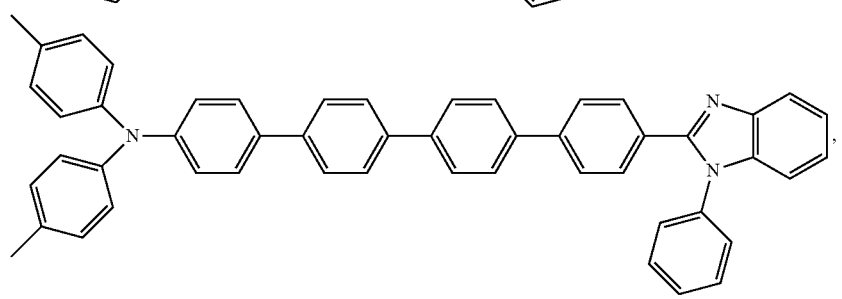
(Host-1)
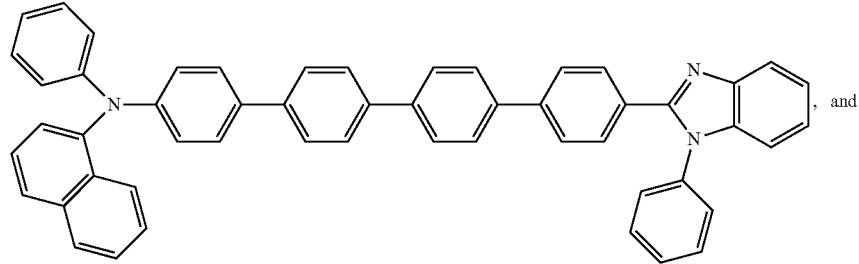
, and
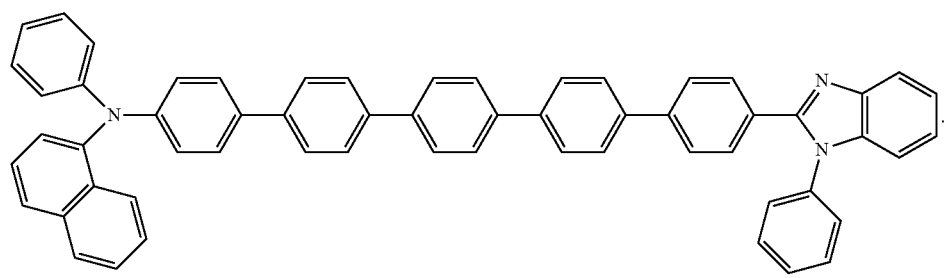

In some embodiments, the host comprises, or consists essentially of, a non-polymeric compound. Compounds described in U.S. Patent Publication 2011/0062386 and U.S. Provisional Patent Application No. 61/426,259, filed Dec. 22, 2010, both of which are incorporated by reference in their entirety, may also be used as host materials.

Any suitable fluorescent compound or material may be used as a fluorescent dopant in the second fluorescent emissive layer. Generally, the second fluorescent emitter has a low T1, such as about 1.8 eV or less. For example, in one embodiment, the second fluorescent emissive layer comprises BE-1, which has a T1 of about 1.8 eV.

nm, about 5 nm to about 30 nm, about 10 nm to about 20 nm, about 10 nm to about 50 nm, about 10 nm to about 40 nm, about 10 nm to about 30 nm, or about 15 nm thick.

A first fluorescent emissive layer can be a neat fluorescent layer, or may include a fluorescent dopant in a host material. In some embodiments, the first fluorescent emissive layer is blue light-emitting. Generally, any host material described above with respect to the second fluorescent emissive layer can also be used in the first fluorescent emissive layer. Although the second fluorescent emissive layer and the first fluorescent emissive layer can have different host materials,

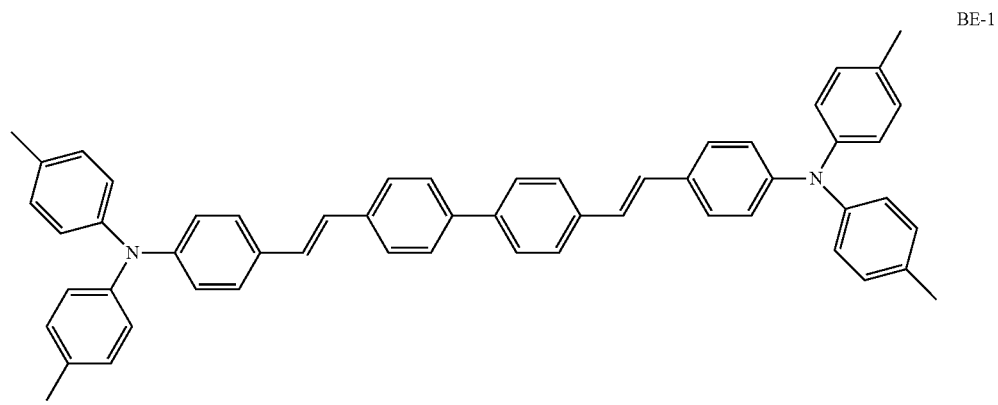

BE-1

Any suitable amount of dopant may be used in the second fluorescent emissive layer. Increasing the amount of dopant can increase device efficiency to a point. However, dopant concentrations that are too high may have an adverse effect upon efficiency due to self quenching by the dopants. Optimum concentrations of dopants can depend upon the photophysical properties of the dopant and the host present in an emissive layer. In some embodiments, the dopant is present at a concentration of about 0.1% (v/v) to about 20% (v/v), about 1% (v/v) to about 10% (v/v), about 4% (v/v) to about 6% (v/v), or about 5% (v/v) in the second fluorescent emissive layer.

Many fluorescent materials may be used as a host or as a dopant depending upon the situation.

The thickness of the second fluorescent emissive layer may vary from device to device depending upon the particular color desired. For example, if the second fluorescent layer emissive layer emits blue light, the thickness of the layer may be increased to make the light of the device more blue, or the thickness of the layer may be decreased to make the light of the device less blue. In some embodiments the second fluorescent emissive layer is about 5 nm to about 50 the second fluorescent emissive layer and a first fluorescent emissive layer can also have the same host material.

If the first fluorescent emissive layer is neat, the host material will generally be the first fluorescent emitter. If the first fluorescent emissive layer is doped, the dopant will normally be the first fluorescent emitter.

The first fluorescent emitter normally has a high T1. For example, the T1 of the first fluorescent emitter (i.e. the first T1) is generally higher than the T1 of the second fluorescent emissive layer. In some embodiments, the first T1 may be about 0.5 eV to about 0.7 eV or about 0.6 eV to about 0.7 eV greater (or higher, i.e. more positive) than the second T1. Typical values for the first T1 could be about 2.3 eV or higher, such as about 2.3 eV to about 2.4 eV, about 2.32 eV to about 2.36 eV, about 2.36 eV to about 2.4 eV, about 2.34 eV, about 2.35 eV, about 2.36 eV, about 2.37 eV, about 2.38 eV, or any value in a range bounded by, or between, any of these T1 values.

Examples of suitable dopants for the first fluorescent emissive layer include following compounds (with the T1 value listed adjacent the compound):

| STRUCTURE | T₁ Value (eV) |
|---|---|
| BE-2 | 2.34 |
|  | 2.35 |
|  | 2.38 |
|  | 2.38 |
|  | 2.36 |

| STRUCTURE | $T_1$ Value (eV) |
|---|---|
| 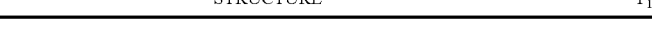 | 2.37 |

In some embodiments, the dopant is present at a concentration of about 0.1% (v/v) to about 20% (v/v), about 1% (v/v) to about 10% (v/v), about 5% (v/v) to about 10% (v/v), or about 7% (v/v) in the first fluorescent emissive layer.

The thickness of the first fluorescent emissive layer may vary from device to device depending upon the particular color desired. For example, if the first fluorescent emissive layer emits blue light, the thickness of the layer may be increased to make the light of the device more blue, or the thickness of the layer may be decreased to make the light of the device less blue. Typically, if the second fluorescent emissive layer is present, the first fluorescent emissive layer is thinner than the second fluorescent emissive layer. For example the second fluorescent emissive layer may be about 1.5 to about 5 times, about 2 times to about 4 times, or about 3 times thicker than the first fluorescent emissive layer. In some embodiments, the first fluorescent emissive layer is about 1 nm to about 10 nm, about 3 nm to about 10 nm, about 3 nm to about 7 nm, or about 5 nm thick.

In some embodiments the combined second fluorescent emissive layer and a first fluorescent emissive layer is about 5 nm to about 50 nm, about 5 nm to about 30 nm, about 10 nm to about 20 nm, about 10 nm to about 50 nm, about 10 nm to about 40 nm, or about 10 nm to about 30 nm, or about 15 nm thick.

In some embodiments where the second fluorescent emissive layer is not present, the first fluorescent emissive layer may be about 5 nm to about 50 nm, about 10 nm to about 30 nm, or about 20 nm thick.

A blocking layer may be disposed between the fluorescent emissive layers and the phosphorescent emissive layers. The blocking layer may at least partially block hole transport and/or exciton transport (including triplet exciton transport) between the fluorescent emissive layers and the phosphorescent emissive layers, e.g. between the first fluorescent emissive layer and the first phosphorescent emissive layer.

In an embodiment, the partial hole-blocking layer allows about 50% to about 95% of the holes reaching the hole blocking layer to pass from the fluorescent emissive layer to the phosphorescent emissive layer. For devices such as that depicted FIG. 3, where the fluorescent emissive layers are between the anode and the blocking layer, this can cause holes to accumulate in the fluorescent emissive layers near the blocking layer. Because electrons may freely pass through the blocking layer, hole-electron recombination can occur primarily in the fluorescent emissive layer near the blocking layer. If the first fluorescent emissive layer is thin, triplet excitons can readily transfer from the higher T1 first fluorescent emissive layer to the lower T1 second fluorescent emissive layer. This quick triplet energy transfer to the lower T1 second fluorescent emissive layer can help to stabilize the emissive construct, since high energy triplets tend to destabilize a device, while helping to improve phosphorescence efficiency in the device, as compared to devices having only lower T1 phosphorescent emissive layers, due to the higher T1 of the first fluorescent emissive layer.

If the blocking layer allows some holes to pass through, hole-electron recombination is likely to occur soon after the hole exits the blocking layer. When hole transport is impeded, the supply of electrons on the opposite side of the blocking layer can be relatively rich due to the relatively small amount electron-hole recombination that occurs. Thus, those holes that do pass through a partial hole blocking layer can quickly recombine with an electron due to the higher electron concentration on the cathode side of a hole blocking layer. Thus, for devices such as those depicted in FIG. 3, where the fluorescent layers are between the anode and the blocking layer, hole-electron recombination can occur in the phosphorescent emissive layers near the blocking layer. If the device comprises a first phosphorescent emissive layer adjacent to the blocking layer and a second phosphorescent emissive layer on the other side of the first phosphorescent emissive layer, a thin first phosphorescent emissive layer can allow part of the recombination zone to be in the second phosphorescent emissive layer. This can help the device to emit, for example, red light from the first phosphorescent emissive layer and yellow light from the second phosphorescent emissive layer. Thus, for example, color can be tuned by varying the size of the first phosphorescent emissive layer.

The thickness of the blocking layer can be used to modulate or tune the color of the light emitting device. A thicker layer can more completely block hole transport. Thus, if the second fluorescent layer and the first fluorescent layer are between the anode and the blocking layer, a thicker blocking layer can confine more holes, and thus more hole-electron recombination, to the fluorescent layers. Since the fluorescent layers tend to emit more blue light, increasing the thickness of the blocking layer can provide a blue shift to the device. Conversely, since the phosphorescent layers tend to emit more red light, decreasing the thickness of the blocking layer to can provide a red shift to the device.

In an embodiment, the partial hole-blocking layer allows about 50% to about 95% of the holes reaching the hole blocking layer to pass from a phosphorescent emissive layer, such as the first phosphorescent emissive layer, to a fluorescent emissive layer, such as the first fluorescent emissive layer.

Thus, for the reasons explained above. The blocking layer can help to confine the electron-hole recombination center. This can help to improve color-stability with respect to applied voltage. Additionally, this recombination zone can include both a fluorescent emissive layer and a phosphorescent emissive layer.

In some embodiments, the blocking layer comprises a hole-blocking material. Various materials can be used in the blocking layer. In some embodiments, the T1 of the blocking layer material is greater than both the T1 of the host material of the fluorescent emissive layers and the T1 of the host material of the phosphorescent emissive layers. In an embodiment, the highest occupied molecular orbital of the blocking layer has a higher energy than a highest occupied molecular orbital of the host material of a phosphorescent emissive layer and/or a fluorescent emissive layer.

Preferably, the blocking layer has a thickness that is less than about one-third of the thickness of the recombination zone. In an embodiment, the thickness of the blocking layer is in the range of about 0.5 nm to about 3 nm, about 0.5 nm to about 2 nm, about 0.5 nm to about 1.5 nm, or about 1 nm.

In some embodiments, the blocking layer can include, for example, 2-(4-biphenylyl)-5-(4-tert-butylphenyl)-1,3,4-oxadiazole (PBD), 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene (BPY-OXD), 2,9-dimethyl-4,7-diphenyl-phenanthroline (bathocuproine or BCP), or 1,3,5-tris[2-N-phenylbenzimidazol-z-yl]benzene (TPBI).

| STRUCTURE | $T_1$ Value |
|---|---|
| 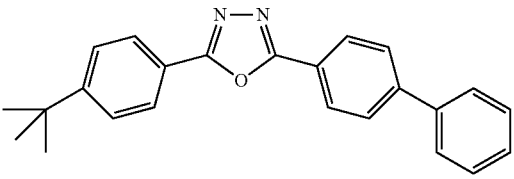<br>PBD | 2.54 |
| 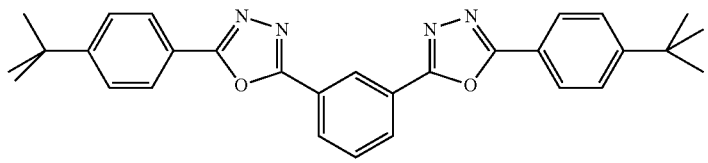<br>OXD-7 | 2.71 |
| 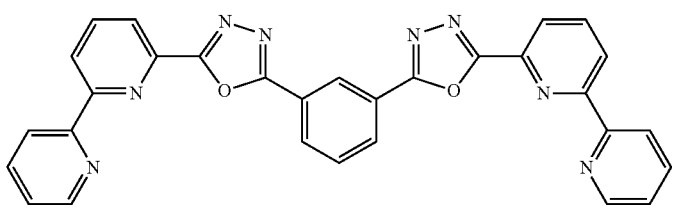<br>BPY-OXD | 2.72 |
| 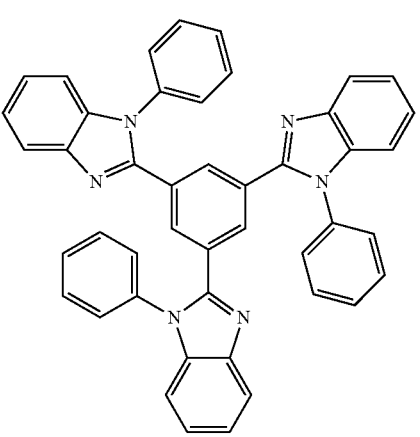<br>TPBi | 2.68 |

| STRUCTURE | $T_1$ Value |
|---|---|
| 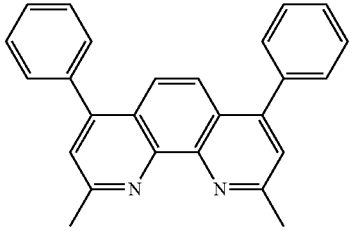 BCP | 2.60 |

The emissive construct should contain at least one phosphorescent emissive layer. In some embodiments, the phosphorescent emissive layer may be a white-light creating complementary phosphorescent emitter. If there is only one phosphorescent emissive layer, it should be either: 1) a neat phosphorescent layer or 2) a phosphorescent layer comprising a host and a phosphorescent dopant. Any materials described below with respect to the first phosphorescent emissive layer and the second phosphorescent emissive layer can be used in this single phosphorescent emissive layer. In some embodiments, the phosphorescent emissive layer can include a yellow phosphorescent dopant and a red phosphorescent dopant.

For emissive constructs with a single phosphorescent emissive layer, the phosphorescent emissive layer can be any suitable thickness, such as about 10 nm to about 60 nm, about 20 nm to about 40 nm, about 5 nm to about 50 nm, about 10 nm to about 50 nm, about 10 nm to about 40 nm, or about 10 nm to about 30 nm, or about 30 nm thick. In an embodiment, both the combined fluorescent emissive layers and the phosphorescent emissive layer are about 20 nm thick.

In some embodiments, there are two phosphorescent emissive layers, a first phosphorescent emissive layer and a second phosphorescent emissive layer. In these embodiments, the first and the second phosphorescent emissive layers emit at wavelengths that are complementary to the blue emissive layer emissive wavelengths to generate a perceived white light when combined with the light emitted by the fluorescent emissive layer.

A first phosphorescent emissive layer can be a neat phosphorescent layer, or may include a phosphorescent dopant in a host material. For a phosphorescent emissive layer, the host should be able to transfer triplet exciton energy to a phosphorescent dopant. It may also be useful for a host material to have hole-transport and/or electron-transport properties.

Generally, any host material described above with respect to the second fluorescent emissive layer can also be used in the first phosphorescent emissive layer. Although the second fluorescent emissive layer and the first phosphorescent emissive layer can have different host materials, the second fluorescent emissive layer and a first phosphorescent emissive layer can also have the same host material. In some embodiments, the first fluorescent emissive layer and the first phosphorescent emissive layer have the same host material.

In some embodiments, host of the first phosphorescent emissive layer is one of the following compounds:

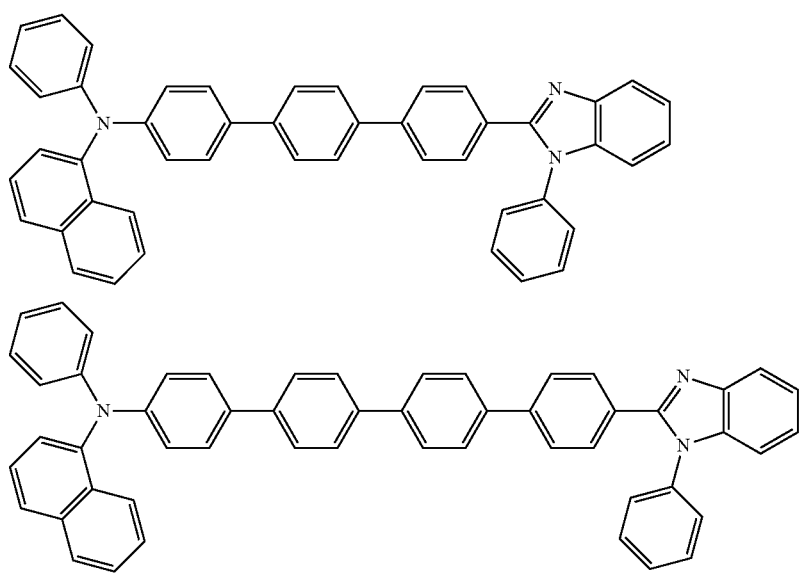

-continued

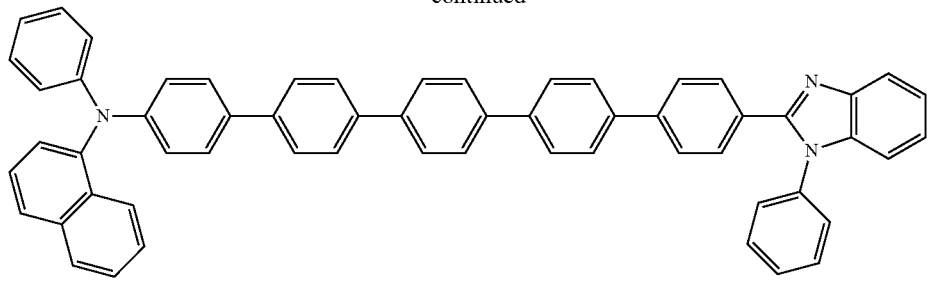

In an embodiment, the T1 of the host in the first phosphorescent emissive layer is greater than the T1 of one or more of the phosphorescent dopants in the first phosphorescent emissive layer. This may allow or facilitate triplet energy transfer from the host to the phosphorescent dopant in that layer.

In some embodiments, the first T1 is greater than the T1 of the first phosphorescent emissive layer. If the triplet energy of the blocking layer is not too high, this may allow or facilitate triplet energy transfer from the first fluorescent emissive layer to the first phosphorescent emissive layer. In some embodiments, the first T1 is greater than the T1 of the phosphorescent dopant in the first phosphorescent emissive layer.

In an embodiment, the first phosphorescent emissive layer is an orange-emitting layer. In an embodiment, the T1 of the host in the fluorescent emissive layer is greater than the T1 of the host in the phosphorescent emissive layer.

Suitable dopants for the first phosphorescent emissive layer include phosphorescent dopants that are (1) yellow (540 nm to about 580 nm) and red emitters (about 550 nm to about 700 nm), (2) green (about 500 nm to about 550 nm) and red (550 nm to 700 nm) emitters, or (3) a single orange emitter (about 550 nm to about 700 nm).

A useful yellow emitting phosphorescent dopant can be YE-01.

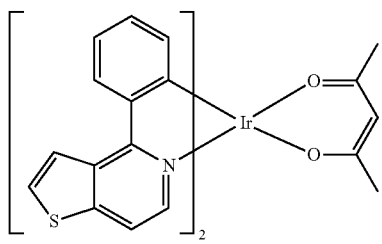

YE-01

A useful red emitting phosphorescent dopant can be Ir(pq)$_2$acac.

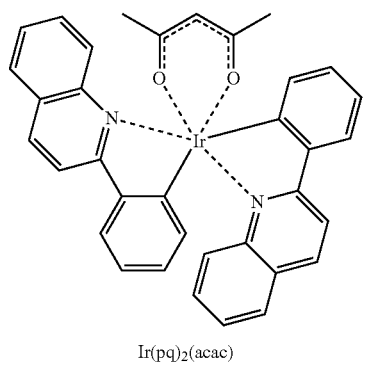

Ir(pq)$_2$(acac)

Another useful red emitting phosphorescent dopant is Ir(piq)$_2$acac.

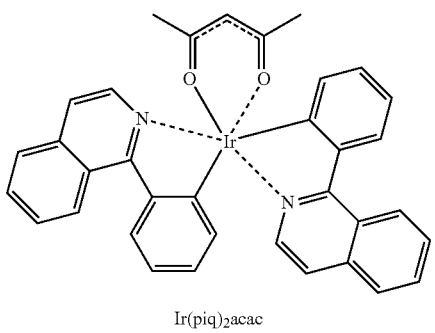

Ir(piq)$_2$acac

Other appropriate complementary emitters can be selected from those described in U.S. patent application Ser. No. 13/293,537, filed Nov. 10, 2011, and U.S. Provisional Patent Application Nos. 61/449,032, filed Mar. 3, 2011, and 61/533,679, filed Sep. 12, 2011, the contents of each of which are incorporated by reference herein in their entirety.

In some embodiments, the first phosphorescent emissive layer comprises a red emitting phosphorescent dopant.

In some embodiments, the first phosphorescent emissive layer or the phosphorescent dopant in the first phosphorescent emissive layer can have a T1 (e.g. the fourth T1) that is about 0.6 eV to about 1.1 eV lower than the T1 of the blocking layer (e.g. the third T1). In some embodiments the first phosphorescent emissive layer or the phosphorescent dopant in the first phosphorescent emissive layer can have a T1 of about 1.6 eV to about 2 eV.

In some embodiments, the first T1 is greater than the T1 of the phosphorescent dopant in the first phosphorescent emissive layer.

Similar to the fluorescent emissive layers, any suitable amount of dopant may be used in the first phosphorescent emissive layer. As explained above, depending upon the photophysics of the host and the dopant, increasing the amount of dopant can increase device efficiency, but dopant concentrations that are too high may have an adverse effect upon efficiency due to self quenching by the dopants. In some embodiments, the dopant is present at a concentration of about 0.1% (v/v) to about 5% (v/v), about 0.1% (v/v) to about 1% (v/v), about 0.4% (v/v) to about 0.6% (v/v), or about 0.5% (v/v) in the first phosphorescent emissive layer.

The thickness of the first phosphorescent emissive layer may vary from device to device depending upon the particular color desired. For example, if the first phosphorescent layer emissive layer emits red light, the thickness of the layer may be increased to make the light of the device more red, or the thickness of the layer may be decreased to make the light of the device less red. Typically, the first phosphorescent emissive layer is thinner than the second phosphorescent emissive layer. For example the second phosphorescent emissive layer may be about 5 times to about 60 times, 5 times to about 200 times, about 50 times to about 100 times, about 20 times to about 40 times, about 80 times, about 20 times, or about 30 times thicker than the first phosphorescent emissive layer. In some embodiments, the first phosphorescent emissive layer is about 0.1 nm to about 5 nm, about 0.3 nm to about 1 nm, about 0.5 nm to about 2 nm, about 0.5 nm, or about 1 nm thick.

A second phosphorescent emissive layer can be a neat phosphorescent layer, or may include a phosphorescent dopant in a host material. For a phosphorescent emissive layer, the host should be able to transfer triplet exciton energy to a phosphorescent dopant. It may also be useful for a host material to have hole-transport and/or electron-transport properties.

Generally, any host material described above with respect to the first phosphorescent emissive layer can also be used in the first phosphorescent emissive layer. Although the first phosphorescent emissive layer and the second phosphorescent emissive layer can have different host materials, the first phosphorescent emissive layer and a second phosphorescent emissive layer can also have the same host material. In some embodiments the second fluorescent emissive layer and the second phosphorescent emissive layer have the same host material. In some embodiments, the first fluorescent emissive layer and the second phosphorescent emissive layer have the same host material. In some embodiments, the second fluorescent emissive layer, the first fluorescent emissive layer, the first phosphorescent emissive layer, and the second phosphorescent emissive layer all have the same host material.

In an embodiment, the T1 of the host in the first phosphorescent emissive layer is greater than the T1 of one or more of the phosphorescent dopants in the second phosphorescent emissive layer. This may allow or facilitate triplet energy transfer from the host to the phosphorescent dopant in that layer.

In some embodiments, the first T1 is greater than the T1 of the second phosphorescent emissive layer (i.e. the fifth T1).

In an embodiment, the second phosphorescent emissive layer is an orange-emitting layer. In an embodiment, the T1 of the host in the fluorescent emissive layer is greater than the T1 of the host in the second phosphorescent emissive layer.

Suitable dopants for the second phosphorescent emissive layer include phosphorescent dopants that are (1) yellow (540 nm to about 580 nm) and red emitters (about 550 nm to about 700 nm), (2) green (about 500 nm to about 550 nm) and red (550 nm to 700 nm) emitters, or (3) a single orange emitter (about 550 nm to about 700 nm). In some embodiments, the phosphorescent emissive layers comprise a material or materials that emit(s) a complementary color light, such that the blue light emitted from the fluorescent blue emitting layers combines in whole or in part with the phosphorescent emission of the phosphorescent emissive layers to provide a perceived white light.

In some embodiments, the second phosphorescent emissive layer comprises a yellow emitting phosphorescent dopant.

In some embodiments, the dopant is present at a concentration of about 0.1% (v/v) to about 20% (v/v), about 1% (v/v) to about 10% (v/v), about 5% (v/v) to about 10% (v/v), or about 6% (v/v) in the second phosphorescent emissive layer.

In some embodiments, the second phosphorescent emissive layer comprises a yellow emitting compound and the first phosphorescent emissive layer comprises a red emitting compound.

In an embodiment, the second phosphorescent emissive layer is about 10 nm to about 60 nm, about 20 nm to about 40 nm, about 5 nm to about 50 nm, about 10 nm to about 50 nm, about 10 nm to about 40 nm, or about 10 nm to about 30 nm, about 40 nm to about 50 nm, about 40 nm, or about 30 nm thick.

In some embodiments, the combined first phosphorescent emissive layer and the second phosphorescent emissive layer are about 10 nm to about 60 nm, about 20 nm to about 40 nm, about 5 nm to about 50 nm, about 10 nm to about 50 nm, about 10 nm to about 40 nm, or about 10 nm to about 30 nm, or about 31 nm thick.

The cathode can be a semi-transparent metal layer comprising metal alloys (such as Mg:Ag mixture), a bi-layer structure (such as Ca/Au), or a transparent electrode (such as ITO, Al:ZnO). The cathode can also comprise transparent and conducting carbon materials (such as CNT, grapheme).

In an embodiment, the reflective-opaque anode comprises an Ag and Al bi-layer.

A hole-transport layer may comprise at least one hole-transport material. Hole-transport materials may include, but are not limited to, an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; an oxadiazole; copper phthalocyanine; 1,1-bis(4-bis(4-methylphenyl)aminophenyl)cyclohexane; 2,9-dimethyl-4,7-diphenyl-1,10-phenanthroline; 3,5-bis(4-tert-butyl-phenyl)-4-phenyl[1,2,4]triazole; 3,4,5-triphenyl-1,2,3-triazole; 4,4',4'-tris(3-methylphenylphenylamino)triphenylamine (MTDATA); N,N'-bis(3-methylphenyl)N,N'-diphenyl-[1,1'-biphenyl]-4,4'-diamine (TPD); 4,4'-bis[N-(naphthyl)-N-phenyl-amino]biphenyl (α-NPD); 4,4',4"-tris(carbazol-9-yl)-triphenylamine (TCTA); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); bis[4-(p,p'-ditolyl-amino)phenyl]diphenylsilane (DTASi); 2,2'-bis(4-carbazolylphenyl)-1,1'-biphenyl (4CzPBP); N,N'N"'-1,3,5-tricarbazoloylbenzene (tCP); N,N'-bis(4-butylphenyl)-N,N'-bis(phenyl)benzidine; or the like.

The hole-transport layer can be partially p-doped. In a partially doped layer, part of the layer, or a sublayer, is substantially free of dopants.

A hole-injection layer may comprise at least one hole-injection material. Hole-injection materials may include, but are not limited to, a transition metal oxide, a polythiophene derivative such as poly(3,4-ethylenedioxythiophene (PEDOT)/polystyrene sulphonic acid (PSS), a benzidine derivative such as N,N,N',N'-tetraphenylbenzidine, poly(N,N'-bis (4-butylphenyl)-N,N'-bis(phenyl)benzidine), a triphenyl amine or phenylenediamine derivative such as N,N'-bis(4-methylphenyl)-N,N'-bis(phenyl)-1,4-phenylenediamine, 4,4',4''-tris(N-(naphthylen-2-yl)-N-phenylamino)triphenylamine, an oxadiazole derivative such as 1,3-bis(5-(4-diphenylamino)phenyl-1,3,4-oxadiazol-2-yl)benzene, a polyacetylene derivative such as poly(1,2-bis-benzylthio-acetylene), and a phthalocyanine metal complex derivative such as phthalocyanine copper.

An electron-transport layer may comprise at least one electron-transport material. Electron-transport materials may include, but are not limited to, 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) ($Alq_3$); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4-triazole (TAZ), 2,9-dimethyl-4,7-diphenyl-phenanthroline (bathocuproine or BCP); and 1,3,5-tris[2-N-phenylbenzimidazol-z-yl]benzene (TPBI). In one embodiment, the electron-transport layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a combination thereof. An electron-transport layer can be partially n-doped.

An electron-injection layer may comprise at least one electron-injection material. Electron-injection materials may include, but are not limited to, an optionally substituted compound selected from the following: aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI) a triazine, a metal chelate of 8-hydroxyquinoline such as tris(8-hydroxyquinoliate)aluminum, and a metal thioxinoid compound such as bis(8-quinolinethiolato) zinc. In one embodiment, the electron-injection layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a combination thereof.

A light emission enhancement layer can comprise transparent materials, which may comprise both organic small molecules and inorganic materials including metal oxide, or wide band gap semiconductor compounds (band gap larger than blue light, wavelength shorter than 450 nm). In some embodiments, the light emission enhancement layer comprises $MoO_3$.

A light scattering layer may comprise a thermal deposited porous nanostructured film. Some nanostructured materials useful in the light scattering layer include those described in co-pending patent applications and provisional applications, U.S. patent application Ser. No. 13/410,812, filed 2 Mar. 2012; Ser. No. 61/696,084, and filed 31 Aug. 2012, Ser. No. 61/558,217, filed 10 Nov. 2011, which are incorporated by reference in their entirety herein, particularly for the discussion of these types of nanostructured materials. In some embodiments, the light scattering layer comprises nanostructured 3,5-bis(3-(benzo[d]oxazol-2-yl)phenyl)pyridine.

A substrate may be composed of any suitable transparent material such as glass, transparent polymers and transparent plastics. In some embodiments, the substrate is glass.

In some embodiments, the insulating layer comprises SiN.

The materials of the substrate, the insulating layer, the reflective and opaque anode, the hole-injection layer, the hole-transport layer, the electron-transport layer, the electron-injection layer, the semi transparent or transparent cathode, the light emission enhancement layer, and the light scattering layer are further described in U.S. Provisional Patent Application No. 61/533,679, filed Sep. 12, 2011, which is further incorporated by reference in its entirety herein, particularly for the discussion of these types of OLED layers.

Another embodiment provides a method for color tuning a top-emission white organic light-emitting diode. In an embodiment, the method comprises inserting an emissive construct, as described herein, between an anode and a cathode. Color is tuned by varying the thickness of one or more of the first fluorescent emissive layer, the first phosphorescent emissive layer, and the barrier layer as described above.

For lighting applications, top-emission white organic light emitting diode can suffer from lower efficiency, color changing with viewing angles, and complex device structure. The devices described herein, considering overall device design and materials selected for each layer of the device, may improve these potential deficiencies. Additionally, the emissive construct can allow a simple device structure, easy processing, and device fabrication by thermal deposition. Furthermore, some OLEDs comprising the emissive construct have achieved a new world record in the device power efficiency for a device with a white color that meets the DOE general lighting requirements and color insensitivity with respect to different viewing angles.

Some OLEDs can have a power efficiency of at least about 20 lm/w, at least about 25 lm/w, at least about 30 lm/w, at least about 33 lm/w, at least about 40 lm/w, or at least about 43 lm/w, about 20 lm/w to about 100 lm/w, about 25 lm/w to about 50 lm/w, about 30 lm/w to about 50 lm/w, about 33 lm/w to about 50 lm/w, about 40 lm/w to about 50 lm/w, or about 43 lm/w to about 50 lm/w, at a brightness of 1000 nit.

Some OLEDs can have a time to loss of 50% of brightness, or a $T_{50}$ lifetime, of at least about 40 hours, at least about 45 hours, at least about 90 hours, at least about 93 hours, at least about 100 hours, at least about 110 hours, and up to about 160 hours, about 200 hours, about 1000 hours, or about 10,000 hours, at a current of 3 mA.

Some OLEDs have a low angle dependency on the observed color. In some embodiments, the absolute value of the difference between the individual CIE coordinates of an OLED at a 0° viewing angle and at a 70° viewing angle is within about 0.1, about 0.05, about 0.03, or about 0.02. For example, if the CIE coordinates at 0° are (0.448, 0.417) and the CIE coordinates at 70° are (0.429, 0.431), then the absolute value of difference between the individual CIE coordinates is 0.019 and 0.014.

In some embodiments, the peaks in the electroluminescence spectrum of an OLED at 0° are within 25 nm, within 10 nm, or within 5 nm of the peaks in the electroluminescence spectrum of the OLED at 70°; and/or the relative high of each peak in the electroluminescence spectrum of an OLED at 0° is within about 50%, 30%, or 20% of the relative height of each peak in the electroluminescence spectrum of the OLED at 70°, wherein the relative height of a peak is the height of the peak as compared to the highest peak in the spectrum.

With respect to OLEDs having a first fluorescent emissive layer and no second fluorescent emissive layer, in some embodiments, an OLED has a power efficiency of at least about 30 lm, at least about 40 lm/w, about 40 lm/w to about 50 lm/w, about 45 lm/w to about 50 lm/w, or about 50 lm/w, at 1000 nit.

With respect to OLEDs having a first fluorescent emissive layer and no second fluorescent emissive layer, in some embodiments, an OLED has a $T_{50}$ of at least about 20 h, at least about 30 h, at least about 40 h, about 40 h to about 100 h, about 40 h to about 50 h, or about 45 h, at 14270 nit.

EXAMPLES

It has been discovered that embodiments of top-emission white OLEDs produced using the systems and methods disclosed above can achieve simple device structure and easier processing. The OLEDs can be manufactured using thermal deposition and provide improved device power efficiency. These benefits are further shown by the following examples, which are intended to be illustrative of the embodiments of the disclosure, but are not intended to limit the scope or underlying principles in any way.

Example 1—Device Fabrication

The device as shown in FIG. 4 was constructed as follows. Pre-cleaned glass substrates with 40 nm thick SiN covered layer, were baked at about 200° C. for about 1 hour under ambient environment, then under UV-ozone treatment for about 30 minutes. The substrates were loaded into a deposition chamber. A reflective bottom anode, (100 nm Al layer) was deposited at a rate of about 2 Å/s. Molybdenum oxide ($MoO_3$, about 5 nm) was deposited as a hole-injection layer at deposition rate of about 1 Å/s. Then a p-doping layer (20 nm), $MoO_3$ was co-deposited with 4,4'-bis[N-(naphthyl)-N-phenyl-amino]biphenyl (NPB) at 5% in volume ratio at the deposition rate of about 0.05 1 Å/s and about 1 Å/s for $MoO_3$ and NPB, respectively. A layer of NPB (about 30 nm) was then deposited as a hole-transport layer. A second fluorescent blue emissive layer (15 nm) was then deposited having a fluorescent blue emitter (BE-1) that was co-deposited with a host material (Host-1) at 5% in volume with the deposition rate of about 0.05 Å/s for BE-1 and about 1 Å/s for Host-1. A first fluorescent blue emissive layer (5 nm) was then deposited having a fluorescent blue emitter (BE-2) that was co-deposited with a host material (Host-1) at 7% in volume with the deposition rate of about 0.07 Å/s for BE-2 and about 1 Å/s for Host-1.

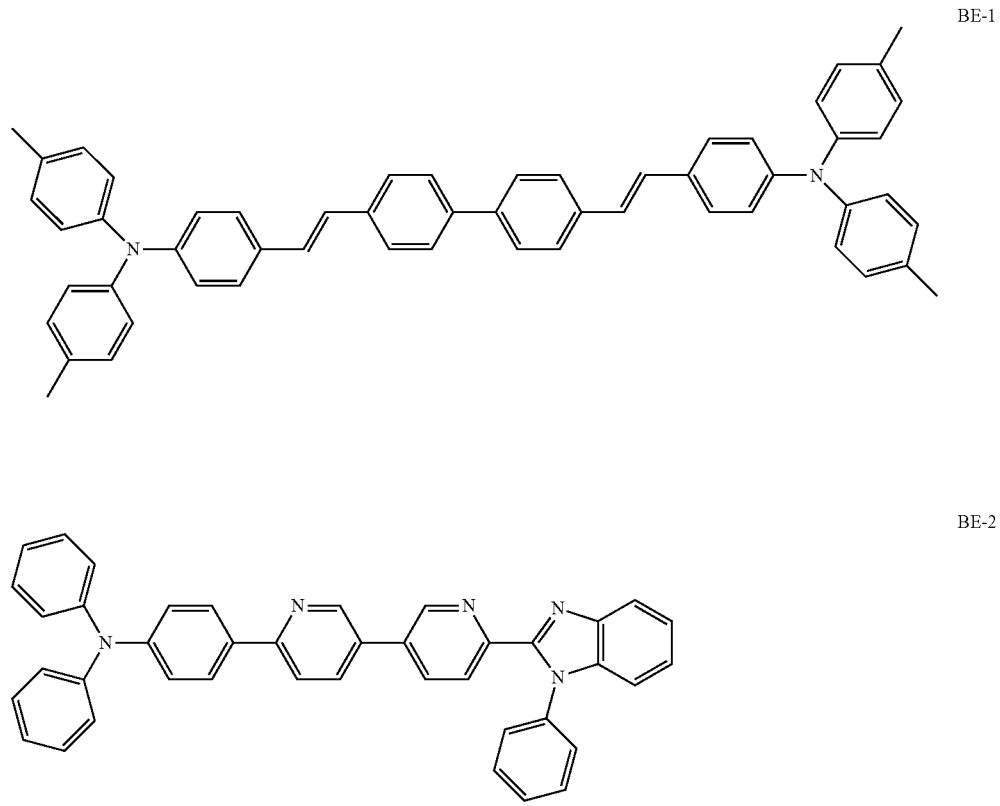

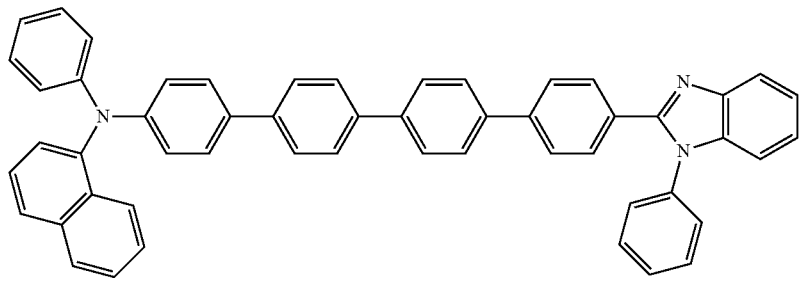

Host-1

Then, a blocking layer of 1,3,5-tris(1-phenyl-1H-benzimidazol-)2-yl)benzene (TPBI) was deposited on top of the fluorescent blue emissive layer at about 0.1 Å/s for a thickness of about 1 nm. Then deposition of the first phosphorescent emissive layer of co-deposition of host (Host-1) with red emitter (Ir(pq)$_2$acac) at the deposition rate of about 1 Å/s for Host-1, and about 0.005 Å/s for Ir(pq)$_2$acac. Then deposition of the second phosphorescent emissive layer (30 nm) of co-deposition of host (Host-1) with yellow emitter (YE-1) at a deposition rate of about 1 Å/s for Host-1 and about 0.05 Å/s for YE-1.

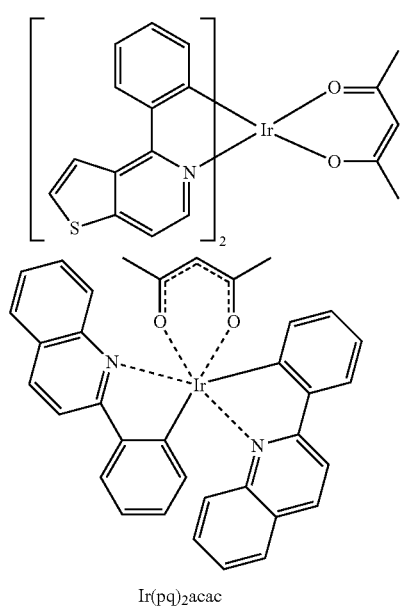

YE-1

Ir(pq)$_2$acac

The doping concentration of the yellow emitter and the red emitter were about 6% and about 0.5% by volume, respectively. Next, an electron-transport layer (TPBI) of about 30 nm was deposited at the deposition rate of about 1 Å/s. The electron-injection layer was then deposited as a thin layer of lithium fluoride (LiF, 1 nm thick, deposition rate 0.1 Å/s). A semi-transparent cathode (about 17 nm) was deposited by co-deposition of magnesium (Mg) and silver (Ag) at a ratio of about 1:5 by volume. A light enhancement layer of MoO$_3$ (70 nm) was deposited on top of the cathode. Finally a light scattering layer of nanostructured material (3,5-bis (3-(benzo[d]oxazol-2-yl)phenyl)pyridine) was deposited on top of the light enhancement layer at deposition rate of about 2 Å/s for 600 nm. All the deposition was done at a base pressure of about 2×10$^{-7}$ torr. The device area was approximately 7.7 mm$^2$.

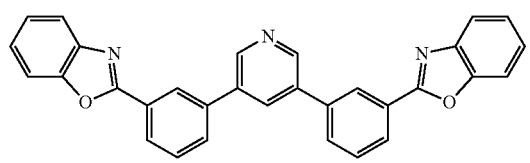 [SMILES: c1cc(-c2cncc(-c3cccc(-c4nc5ccccc5o4)c3)c2)cc(-c2nc3ccccc3o2)c1]

3,5-bis(3-(benzo[d]oxazol-2-yl)phenyl)pyridine

Additional devices were constructed in the same manner, except that the thickness of the lower-T1 fluorescent blue emitter layer (the second fluorescent layer) was varied as indicated in Table 1.

TABLE 1

| Blue emissive layer | PE (lm/w) | T$_{50}$(h) at 3 mA |
|---|---|---|
| Low-T1 only | 18 | 160 |
| Low-T1 (25 nm) | 26 | 110 |
| Low-T1 (15 nm) | 33 | 95 |
| Low-T1 (10 nm) | 43 | 45 |
| High-T1 only | 50 | 30 |

Figure 5:
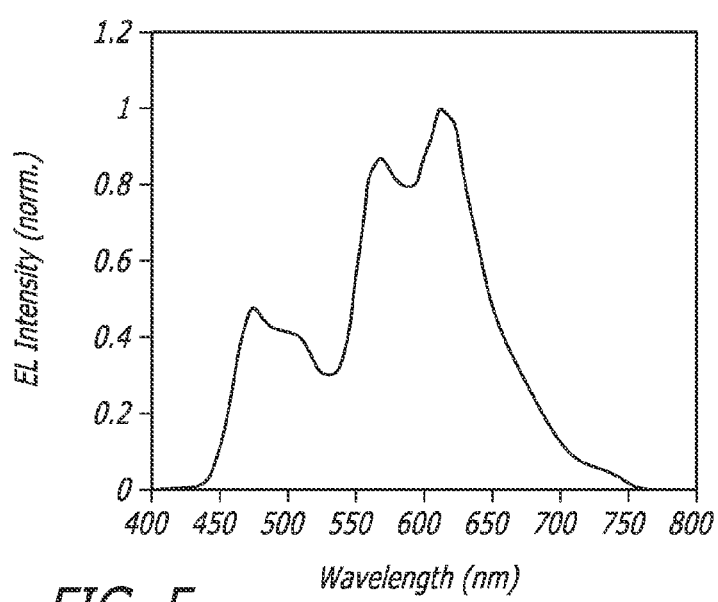
FIG. 5 depicts the electroluminescence (EL) spectrum of an embodiment of a white TE-OLED device at 0° viewing angle.
Figure 6:
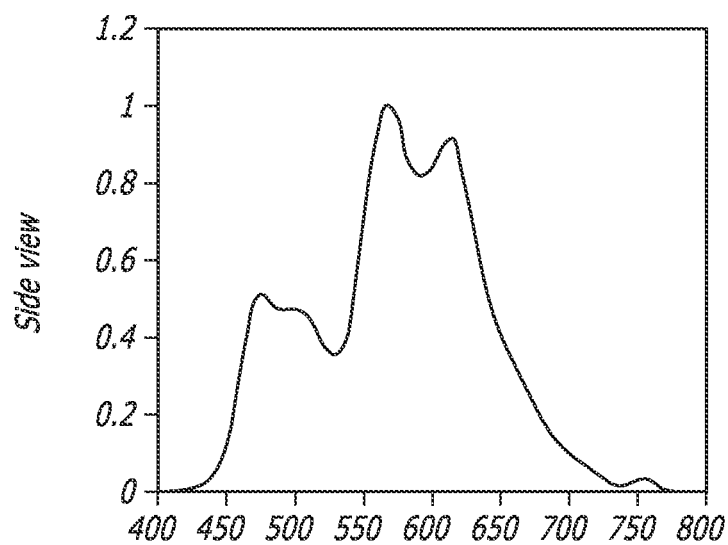
FIG. 6 depicts the EL spectrum of an embodiment of a white TE-OLED device at 70° viewing angle.

The electroluminescence spectrum of Example 1 was measured. FIG. 5 shows an EL spectrum of the TE-WOLED of FIG. 4 at a 0° viewing angle. FIG. 6 shows an EL spectrum at 70° viewing angle. At 0°, the CRI was 79, and the CIE coordinates were (0.448, 0.417). At 70°, the CRI was 73, and the CIE coordinates were (0.429, 0.431), respectively As shown in FIGS. 5 and 6, the blocking layer effectively confines the charge recombination center at the interface between the orange and blue emissive layers, giving stable emissive color at higher brightness.

Figure 7:
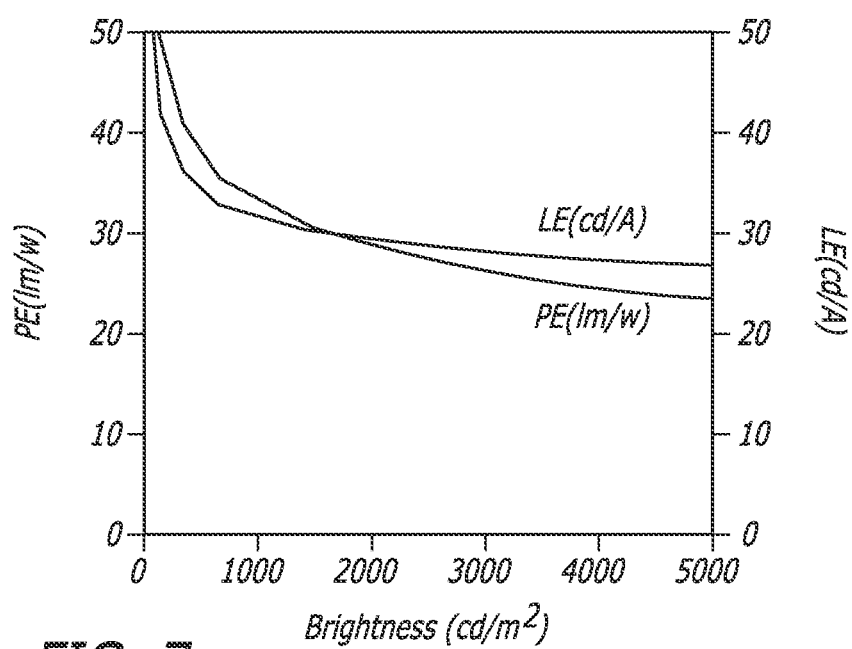
FIG. 7 depicts the current efficiency and power efficiency as a function of brightness (cd/m$^2$) of an embodiment of a white TE-OLED device.

The brightness dependence of the current efficiency and power efficiency of Example 1 was also measured. FIG. 7 shows the brightness dependence of current efficiency (LE) and power efficiency (PE) of an embodiment of a white TE-OLED device. This device shows, at 1000 nit, 33.4 lm/w, 31.6 cd/A, 12.6% EQE.

Figure 8:
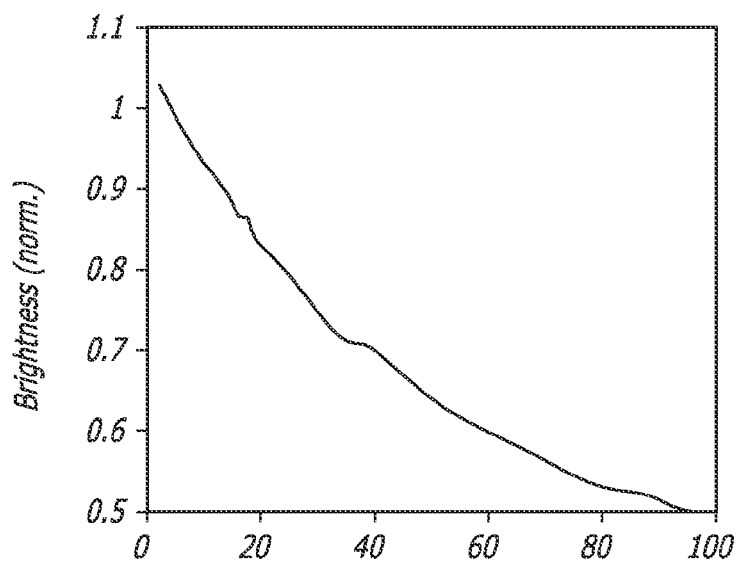
FIG. 8 depicts the brightness level over the lifetime of an embodiment of a white TE-OLED device.
Figure 9:
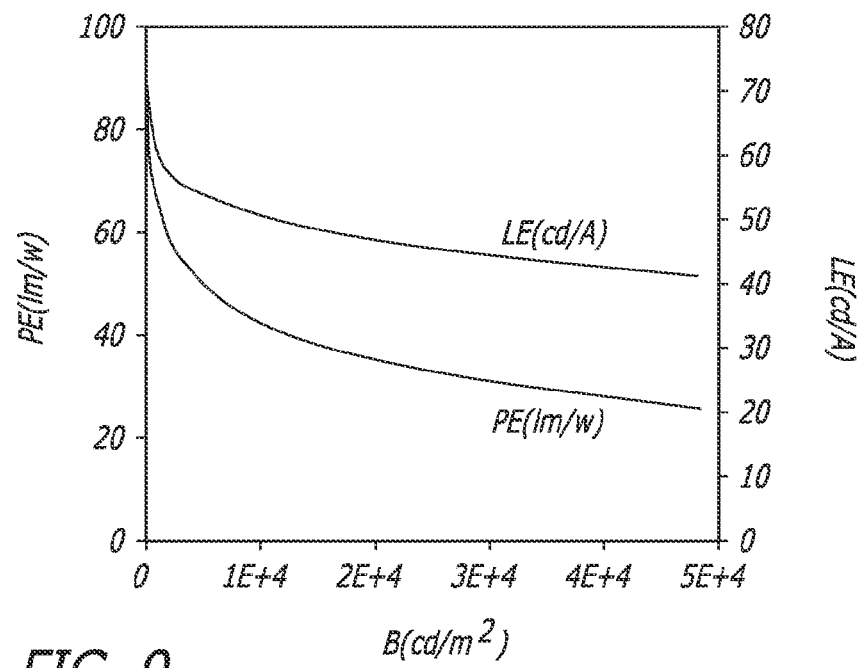
FIG. 9 depicts the current efficiency and power efficiency as a function of brightness (cd/m$^2$) of an embodiment of a white TE-OLED device.

FIG. 8 shows the brightness level (B [cd/m2]) over the lifetime of a device in accordance with Example 1. FIG. 9 shows the efficiency over the lifetime of Example 1. As shown in FIGS. 7, 8 and Table-1, the device lifetime and stability is improved.

Example 2

Figure 10:
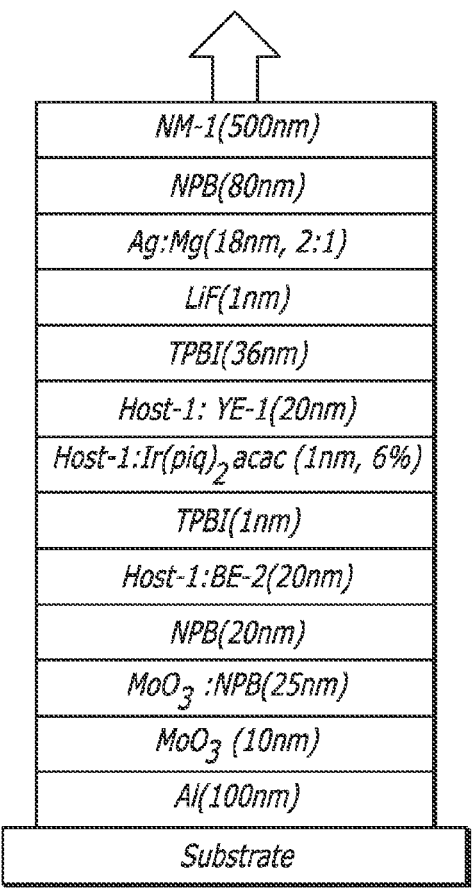
FIG. 10 depicts the OLED device of Example 2.
Figure 11:
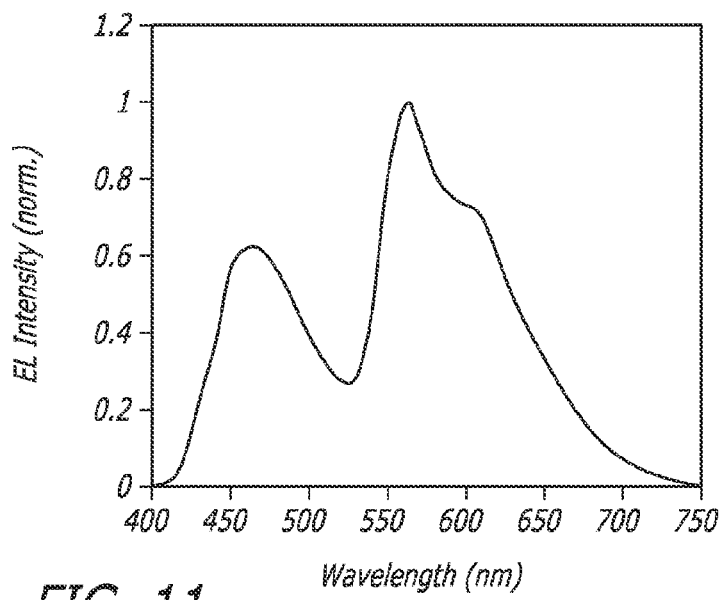
FIG. 11 depicts the electroluminescence spectrum of the OLED of Example 2.
Figure 12:
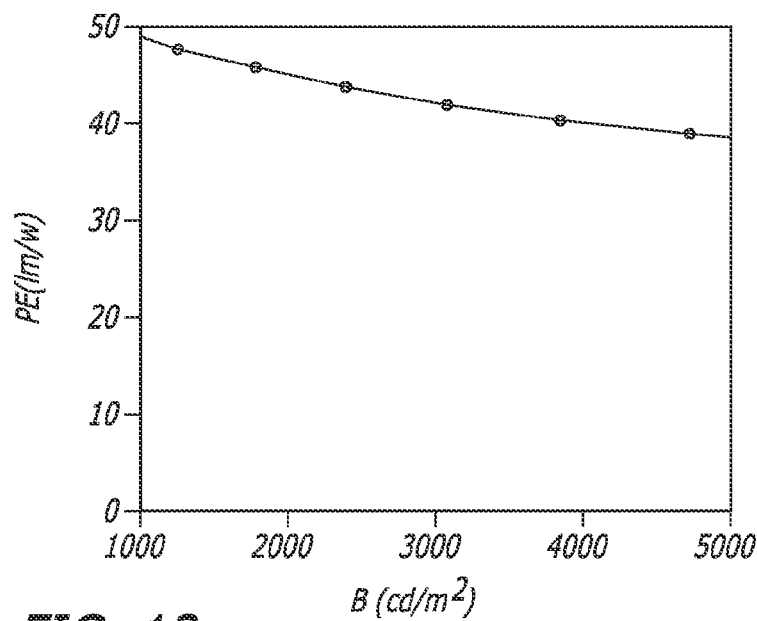
FIG. 12 depicts the brightness dependence power efficiency (PE) of the OLED of Example 2.
Figure 13:
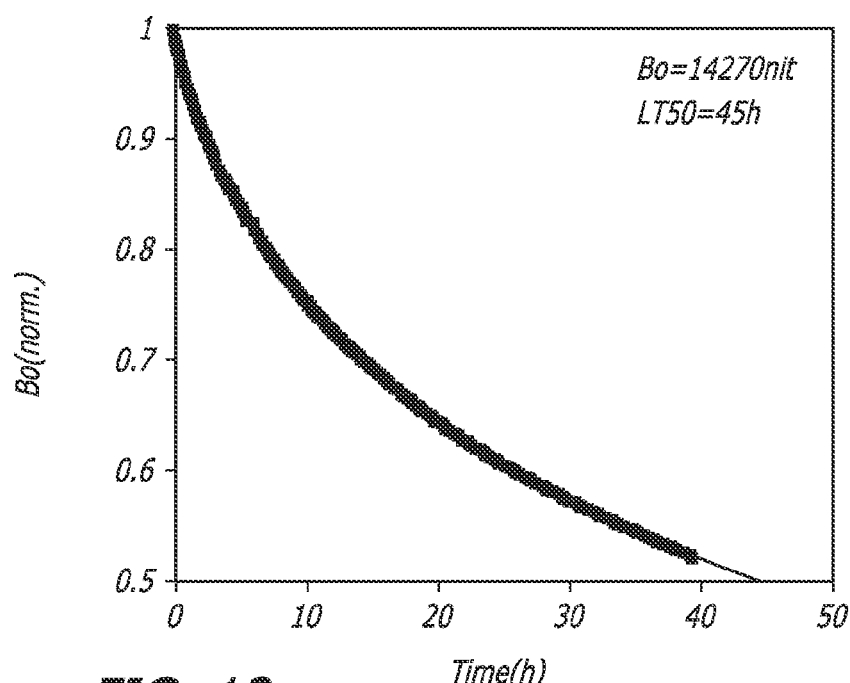
FIG. 13 shows a stress test for the device of Example 2.

An OLED device having the structure of FIG. 10 was prepared according to the methods of Example 1. This device, going from bottom to top, included a substrate, an anode (Al 100 nm), a hole-injection layer (MoO$_3$, 5 nm), a hole transport layer (MoO$_3$, NPB, 25 nm), a first fluorescent emissive layer (HOST-1:BE-2, 20 nm, 7%), a blocking layer (TPBI, 1 nm), a first phosphorescent emissive layer (HOST-1: Ir(piq)$_2$acac, 1 nm, 6%, a second phosphorescent emissive layer (HOST-1:YE-1, 20 nm), an electron-transport layer (TPBI, 36 nm), an electron-injection layer (LiF, 1 nm), a cathode (Ag:Mg 18 nm, 2:1), a light-emission enhancement layer (NPB, 80 nm), and a light-scattering layer (NM-1, 500 nm). The electroluminescence spectrum of this device is depicted in FIG. 11. FIG. 12 depicts the brightness dependence power efficiency (PE) of this device. The device had a CRI of 71, CIE coordinates of (0.379, 0.370), and a T$_{50}$ of 45 h at 14270 nit. FIG. 13 shows a stress test at 14270 nit for the device.

NM-1

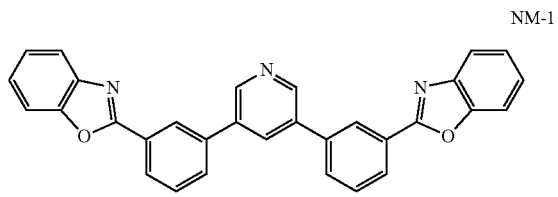 [SMILES: c1cc(-c2cncc(-c3cccc(-c4nc5ccccc5o4)c3)c2)cc(-c2nc3ccccc3o2)c1]

Although the subject matter of the claims have been disclosed in the context of certain embodiments and examples, it will be understood by those skilled in the art that the scope of the claims extends beyond the specifically disclosed embodiments to other alternative embodiments and/or uses of the invention and obvious modifications and equivalents thereof. Thus, it is intended that the scope of the present claims should not be limited by the particular disclosed embodiments described above.

What is claimed is:

1. An emissive construct comprising:
   a second fluorescent blue emissive layer comprising a second fluorescent emitter having a second T1, wherein T1 is the energy of the lowest energy triplet state;
   a first fluorescent blue emissive layer contacting the second fluorescent emissive layer, said first fluorescent blue emissive layer comprising a first fluorescent emitter having a first T1, said second T1 less than said first T1;
   a blocking layer comprising hole blocking material having a third T1, said third T1 higher than or equal to said first T1;
   a first phosphorescent emissive layer contacting said blocking layer; and
   a second phosphorescent emissive layer contacting said first phosphorescent emissive layer;
   wherein the first phosphorescent emissive layer has a fourth T1 and the second phosphorescent emissive layer has a fifth T1, and wherein the first T1 is greater than the fourth T1 and the fifth T1.

2. The emissive construct of claim 1, which is configured to allow triplet excitons to be transferred from the first fluorescent emissive layer to the second fluorescent emissive layer.

3. The emissive construct of claim 1, wherein the first phosphorescent emissive layer contacts the second phosphorescent emissive layer.

4. The emissive construct of claim 1, wherein the first phosphorescent emissive layer contacts the blocking layer.

5. The emissive construct of claim 1, which is configured to allow triplet excitons to be transferred from the blocking layer to the first fluorescent emissive layer.

6. The emissive construct of claim 1, which is configured to allow triplet excitons to be transferred from the blocking layer to the first phosphorescent emissive layer.

7. The emissive construct of claim 1, wherein the second fluorescent emissive layer, the first fluorescent emissive layer, the first phosphorescent emissive layer, and the second phosphorescent emissive layer comprise a host material.

8. The emissive construct of claim 7, wherein the second fluorescent emissive layer, the first fluorescent emissive layer, the first phosphorescent emissive layer, and the second phosphorescent emissive layer have the same host material.

9. The emissive construct of claim 8, wherein the host material is

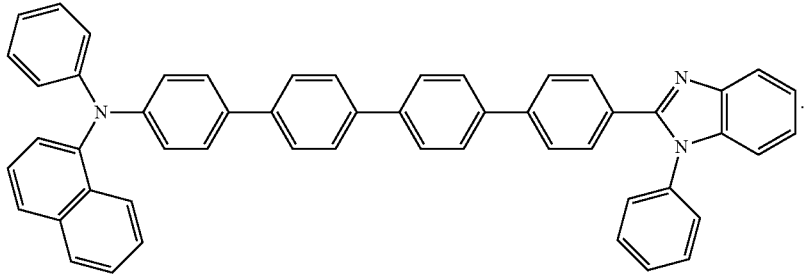 [SMILES: c1ccc(N(c2ccc(-c3ccc(-c4ccc(-c5ccc(-c6nc7ccccc7n6-c6ccccc6)cc5)cc4)cc3)cc2)c2cccc3ccccc23)cc1]

10. The emissive construct of claim 1, wherein the first phosphorescent emissive layer has a fourth T1 and the second phosphorescent emissive layer has a fifth T1, and wherein the first T1 is less than the fourth T1 and the fifth T1.

11. The emissive construct of claim 1, wherein the first and the second phosphorescent emissive layers emit at wavelengths that are complementary to the blue emissive layer emissive wavelengths to generate a perceived white light with the blue emissive layer.

12. The emissive construct of claim 1, wherein the first phosphorescent emissive layer comprises a dopant that is a phosphorescent red emitter.

13. The emissive construct of claim 12, wherein the dopant is

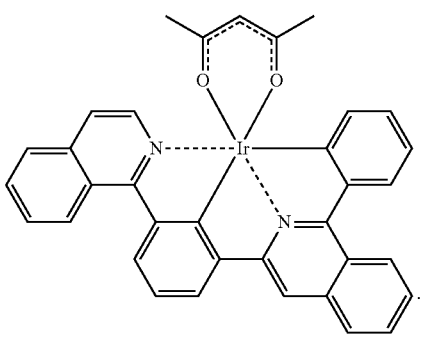

14. The emissive construct of claim 1, wherein the second phosphorescent emissive layer comprises dopant that is a phosphorescent yellow emitter.

15. The emissive construct of claim 14, wherein the phosphorescent yellow emitter is

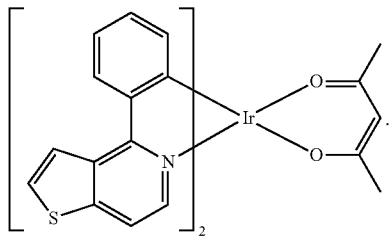

16. The emissive construct of claim 1, wherein the hole blocking material is 1,3,5-tris[2-N-phenylbenzimidazole-2-yl]benzene.

17. An emissive construct comprising:
a second fluorescent emissive layer comprising a second fluorescent emitter having a second T1;
a first fluorescent emissive layer disposed over the second fluorescent emissive layer, said first fluorescent emissive layer comprising a first fluorescent emitter having a first T1;
wherein the second T1 is less than the first T1;
wherein the emissive construct is configured to allow holes to be transferred from the second fluorescent emissive layer to the first fluorescent emissive layer;
a blocking layer comprising hole blocking material having a third T1, and disposed over the first fluorescent emissive layer;
wherein the third T1 is higher than or equal to said first T1;
a first phosphorescent emissive layer disposed over the blocking layer;
wherein the emissive construct is configured to allow electrons to be transferred from the first phosphorescent emissive layer to the blocking layer; and
a second phosphorescent emissive layer disposed over said first phosphorescent emissive layer;
wherein the emissive construct is configured to allow electrons to be transferred from the second phosphorescent emissive layer to the first phosphorescent emissive layer;
wherein the first phosphorescent emissive layer has a fourth T1 and the second phosphorescent emissive layer has a fifth T1, and wherein the first T1 is greater than the fourth T1 and the fifth T1.

18. The emissive construct of claim 17, wherein the second fluorescent emissive layer contacts the first fluorescent emissive layer.

19. An emissive construct comprising:
a second fluorescent emissive layer comprising a second fluorescent emitter having a second T1;
a first fluorescent emissive layer disposed over the second fluorescent emissive layer, said first fluorescent emissive layer comprising a first fluorescent emitter having a first T1;
wherein the second T1 is less than the first T1;
wherein the emissive construct is configured to allow holes to be transferred from the second fluorescent emissive layer to the first fluorescent emissive layer;
a blocking layer comprising hole blocking material having a third T1, and disposed over the first fluorescent emissive layer;
wherein the third T1 is higher than or equal to said first T1; and
a first phosphorescent emissive layer disposed over the blocking layer;
wherein the emissive construct is configured to allow electrons to be transferred from the first phosphorescent emissive layer to the blocking layer;
wherein the first phosphorescent emissive layer has a fourth T1 and the second phosphorescent emissive layer has a fifth T1, and wherein the first T1 is greater than the fourth T1 and the fifth T1.

* * * * *